United States Patent
Nakatsuka

(10) Patent No.: US 6,599,367 B1
(45) Date of Patent: Jul. 29, 2003

(54) VACUUM PROCESSING APPARATUS

(75) Inventor: Sakae Nakatsuka, Yamanashi-Ken (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/623,574

(22) PCT Filed: Mar. 5, 1999

(86) PCT No.: PCT/JP99/01078
§ 371 (c)(1),
(2), (4) Date: Sep. 6, 2000

(87) PCT Pub. No.: WO99/45166
PCT Pub. Date: Sep. 10, 1999

(30) Foreign Application Priority Data

Mar. 6, 1998 (JP) .................... 10-073177

(51) Int. Cl.[7] .................. C23C 16/00; H05H 1/00
(52) U.S. Cl. .............. 118/715; 118/723 E; 118/728; 156/345.34; 156/345.33; 156/345.51
(58) Field of Search .............. 118/715, 728, 118/723 E; 156/345.34, 345.33, 345.51

(56) References Cited

U.S. PATENT DOCUMENTS

| | | |
|---|---|---|
| 4,792,378 A | 12/1988 | Rose et al. |
| 5,451,290 A * | 9/1995 | Salfelder ............... 216/67 |
| 5,624,498 A * | 4/1997 | Lee et al. ............... 118/715 |
| 6,079,356 A * | 6/2000 | Umotoy et al. .......... 118/723 E |
| 6,090,210 A * | 7/2000 | Balance et al. ......... 118/725 |

FOREIGN PATENT DOCUMENTS

| | | | | |
|---|---|---|---|---|
| EP | 1061155 A1 | * | 12/2000 | ........... C23C/16/44 |
| JP | 2-198138 A | * | 8/1990 | ........... C23C/4/00 |
| JP | 3-44471 | | 2/1991 | |
| JP | 4-211115 | | 8/1992 | |
| JP | 6-61157 A | * | 3/1994 | ........ H01L/21/205 |
| JP | 6-151368 A | * | 5/1994 | ........ H01L/21/302 |
| JP | 8-35067 | | 2/1996 | |
| JP | 9-30892 | | 2/1997 | |
| JP | 11-256328 A | * | 9/1999 | ........... C23C/14/50 |

* cited by examiner

*Primary Examiner*—Parviz Hassanzadeh
(74) *Attorney, Agent, or Firm*—Smith, Gambrell & Russell, LLP

(57) ABSTRACT

A vacuum process system having a vacuum process container. Located inside the vacuum process container is a supporting table for supporting thereon an object to be processed, a presser member for pressing the top surface of the peripheral portion of the object onto the supporting table, and a shower head facing the supporting table. The shower head has a large number of gas nozzles in the bottom face thereof. The bottom face of the shower head has a facing portion positioned substantially directly above the inner peripheral edge of the presser member and a non-facing portion. The facing portion has nozzles with larger diameters than the non-facing portion or a higher density of nozzles than the non-facing portion.

6 Claims, 7 Drawing Sheets

|  | SHOWER HEAD PART | SHOWER DIAMETER (mm) | NOZZLE DIAMETER (mm) | UNIFORMITY IN MAIN THIN-FILM DEPOSITION (±%) | THIN-FILM DEPOSITION RATE (Å/min) | UNIFORMITY IN NUCLEAR GROWTH THIN-FILM DEPOSITION (±%) |
|---|---|---|---|---|---|---|
| EXAMPLE 1 | R99mm φ1.3mm | 230 | 1.1, R99 PARTS 1.3 | 5.16 | 3945 | 4.43 |
| EXAMPLE 2 | R99mm φ1.5mm | 230 | 1.1, R99 PARTS 1.5 | 3.94 | 3880 | 3.26 |
| EXAMPLE 3 | R99mm φ1.7mm | 230 | 1.1, R99 PARTS 1.7 | 4.27 | 3760 | 3.15 |
| COMPARATIVE EXAMPLE 1 | STANDARD | 230 | 1.1 | 5.25 | 4248 | 11.18 |
| COMPARATIVE EXAMPLE 2 | φ0.8mm | 230 | 0.8 | 6.98 | 4018 | 5.91 |
| COMPARATIVE EXAMPLE 3 | R100mm φ2.0mm | 200 | 1.1, R100 PARTS 2.0 | 9.27 | 3659 | 3.62 |

FIG. 5

THIN-FILM DEPOSITION CONDITIONS

|  | NUCLEAR THIN-FILM DEPOSITION | MAIN THIN-FILM DEPOSITION |
|---|---|---|
| Temp(°C) | 475 | 475 |
| Press(Pa) | 500 | 10665 |
| Time(sec) | 29 | 72 |
| $WF_6$(sccm) | 15 | 55 |
| Ar(sccm) | 200 | 2000 |
| $SiH_4$(sccm) | 4 | — |
| $H_2$(sccm) | 60 | 1900 |
| $N_2$(sccm) | 600 | 20 |

FIG. 6

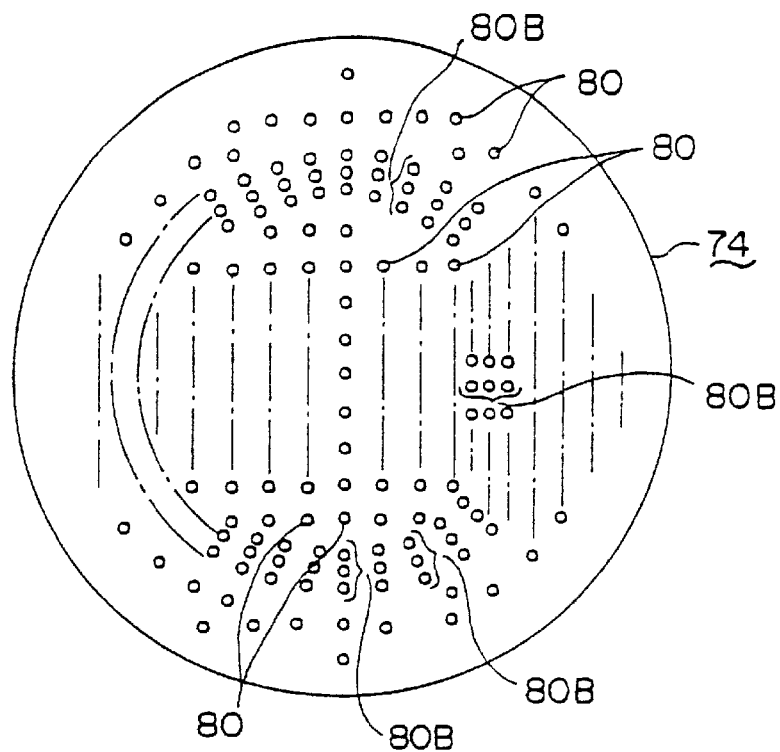
F I G. 10

VACUUM PROCESSING APPARATUS

TECHNICAL FIELD

The present invention relates generally to a vacuum process system, such as a thin-film deposition process system for depositing, e.g., a metal thin film, a silicon oxide film or a silicon film.

BACKGROUND ART

In a typical process for producing a semiconductor integrated circuit, a metal or metal compound, such as W (tungsten), WSi (tungsten silicide), Ti (titanium), TiN (titanium nitride) or TiSi (titanium silicide), is deposited to form a thin film, in order to form a wiring pattern on a semiconductor wafer serving as an object to be processed or in order to fill in a recessed portion between wiring parts or the like.

As methods for forming a metal thin film of this type, there are known three methods, such as the $H_2$ (hydrogen) reduction process, the $SiH_4$ (silane) reduction process and the $SiH_2Cl_2$ (dichlorosilane) reduction process. Among these processes, the $SiH_2Cl_2$ reduction process is a method for forming a W or WSi (tungsten silicide) film at a high temperature of about 600° C. using, e.g., dichlorosilane, as a reducing gas in order to form a wiring pattern. The $SiH_4$ reduction process is a method for forming a W or WSi film at a low temperature of about 450° C., which is lower than that in the $SiH_2Cl_2$ reduction process, using, e.g., silane, as a reducing gas in order to similarly form a wiring pattern. The $H_2$ reduction process is a method for depositing a W film at a temperature of about 400° C. to about 430° C. using, e.g., hydrogen, as a reducing gas in order to fill a recessed portion in the surface of a wafer, such as a recessed portion between wiring parts.

In all of the above described cases, a gas, such as $WF_6$ (tungsten hexafluoride), is used as a process gas.

A typical vacuum process system for forming such a metal thin film is shown in FIG. 11. In the vacuum process system shown in FIG. 11, a supporting table 4 of, e.g., a thin carbon material or an aluminum compound, is provided in a cylindrical vacuum process container 2 of, e.g., aluminum. Below the supporting table 4, a heating means 8, such as a halogen lump, is arranged via a transmission window 6 of quartz. Then, a semiconductor wafer 1 is mounted on the supporting table 4. The peripheral portion of the wafer 1 is held by a vertically movable clamp-ring (a presser member) 10 to be fixed to the supporting table 4. A shower head 13 is provided so as to face the supporting table 4. A large number of gas nozzles 12 are formed in the bottom of the shower head 13 so as to be distributed substantially uniformly.

Heat rays from the heating means 8 pass through the transmission window 6 to reach and heat the supporting table 4 to indirectly heat the semiconductor wafer 1, which is arranged thereon, to maintain the temperature of the semiconductor wafer 1 at a predetermined temperature. Simultaneously, a process gas of, e.g., $WF_6$ or $H_2$, is uniformly supplied onto the surface of the wafer from the gas nozzles 12 of the shower head 13 which is provided above the supporting table 4, so that a metal film of W or the like is formed on the surface of the wafer.

By the way, in the thin-film deposition process on the semiconductor wafer, the in-plane uniformity of the thickness of the film must be maintained to be high from the point of view of the improvement of the electrical characteristics and yields of the device. In the system with the above described construction, the process gas injected from the gas nozzles 12 of the shower head 13 spreads outside uniformly while flowing downwards, to be discharged from an outlet which is arranged below the periphery of the supporting table 4.

In this case, the clamp-ring 10 can not avoid slightly disturbing the flow of the process gas in the peripheral portion of the wafer although, its thickness is only several millimeters. Therefore, the thickness of the film deposited on the peripheral portion of the wafer tends to be smaller than that on the central portion of the wafer, so that there is a problem in that the uniformity of the thickness is bad.

In particular, there is a problem in that the thickness of the film in the central portion of the wafer is greater than that in the peripheral portion thereof to greatly deteriorate the uniformity of the thickness of the film under supply-limited conditions that the thin-film deposition rate depends mainly on the concentration of the gas, although the above described uniformity of the thickness of the film does not so deteriorate under reaction-limited conditions that the thin-film deposition rate depends mainly on a process temperature. Therefore, although various ways for distributing the flow rate of the process gas supplied from the shower head are carried out, the relationship between the flow rate of the gas and the thickness of the film is very delicate, so that the optimum relationship has not been obtained.

Taking account of the above described problems, the present invention has been made in order to effectively solve the problems. It is an object of the present invention to provide a vacuum process system capable of improving the in-plane uniformity of the thickness of a film by causing a shower head part to have a proper distribution of gas feed rate.

DISCLOSURE OF THE INVENTION

In order to solve the above described problems, the present invention provides a vacuum process system comprising: a vacuum process container having therein a supporting table for supporting thereon an object to be processed; a presser member for pressing the top surface of the peripheral portion of the object to fix the object to the supporting table; and a shower head part which is provided so as to face the supporting table and which has a number of gas nozzles in the bottom face thereof, wherein if the bottom face of the shower head part is divided into a facing portion, which faces the inner peripheral edge of the presser member, and a non-facing portion other than the facing portion, the bottom face of the shower head part is formed so that the gas injection quantity per unit area of the non-facing portion is substantially uniform and so that the gas injection quantity per unit area of the facing portion is greater than that of the non-facing portion.

Thus, the gas injection quantity per unit area from the shower head part is substantially uniform in the non-facing portion, and the gas injection quantity per unit area in the facing portion is greater than that in the non-facing portion, so that the thin-film deposition in the central portion of the object to be processed can be suppressed to improve the uniformity of the thickness of the film on the whole object to be processed.

In this case, in order to increase the gas injection quantity per unit area from the shower head part, the diameter of the gas nozzles in a corresponding portion may be greater than the diameter of the gas nozzles in other portions, or the density of the gas nozzles in a corresponding portion may be greater while the diameter of the gas nozzles is set to be the same. Furthermore, the non-facing portion may exist inside and outside of the facing portion in the bottom face of the shower head part.

According to another aspect of the present invention, the bottom face of the shower head part has a substantially annular region, in which the gas injection quantity per unit area is greater than those in other regions, and the annular region is formed substantially directly above the inner peripheral edge of the presser member for fixing the object to the supporting table, along the shape of said inner peripheral edge. In a region inside of the annular region, the gas injection quantity per unit area is substantially uniform and smaller than that in the annular region. Moreover, a region, in which the gas injection quantity per unit area is substantially uniform and smaller than that in the annular region, may be provided outside of the annular region. In this case, the gas injection quantity per unit area in the region inside of the annular region may be substantially the same as that in the region outside thereof.

BRIEF DESCRIPTION OF THE DRAWINGS

FIG. 5 is a table showing the dimensions of the respective portions of the shower head part and the evaluated results of the uniformity of the thickness of the film in the examples of the present invention and the comparative examples which are shown in FIGS. 4A through 4F;

FIG. 6 is a table showing thin-film deposition conditions when the evaluation of the thickness of the film shown in FIG. 5 is carried out;

FIG. 10 is a plan view showing a modified example of a shower head part of a vacuum process system according to the present invention.

BEST MODE FOR CARRYING OUT THE INVENTION

Referring to the accompanying drawings, a preferred embodiment of a vacuum process system according to the present invention will be described in detail below.

Figure 1:
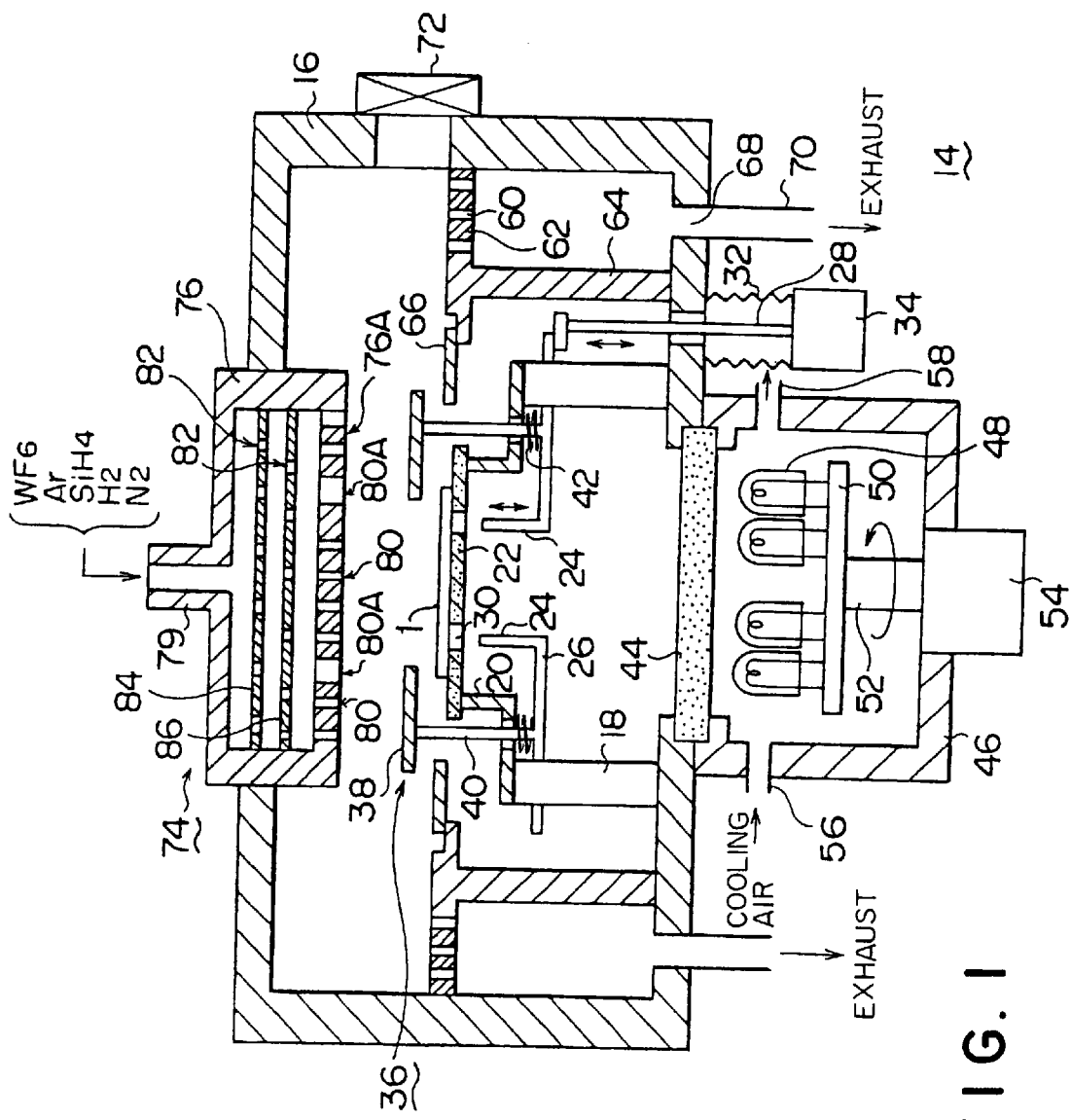
FIG. 1 is a sectional view showing a thin-film deposition system as a preferred embodiment of a vacuum process system according to the present invention.
Figure 2:
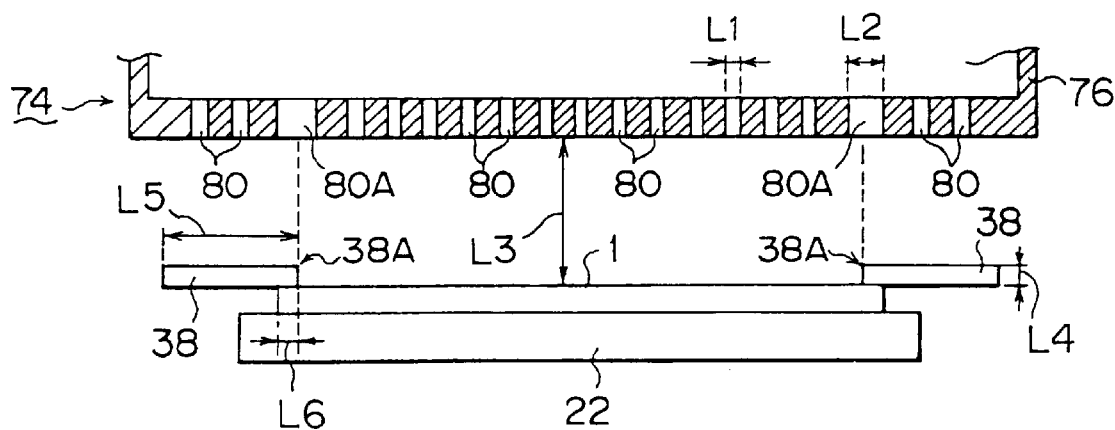
FIG. 2 is an enlarged sectional view showing a shower head part and supporting table part of the system shown in FIG. 1.
Figure 3:
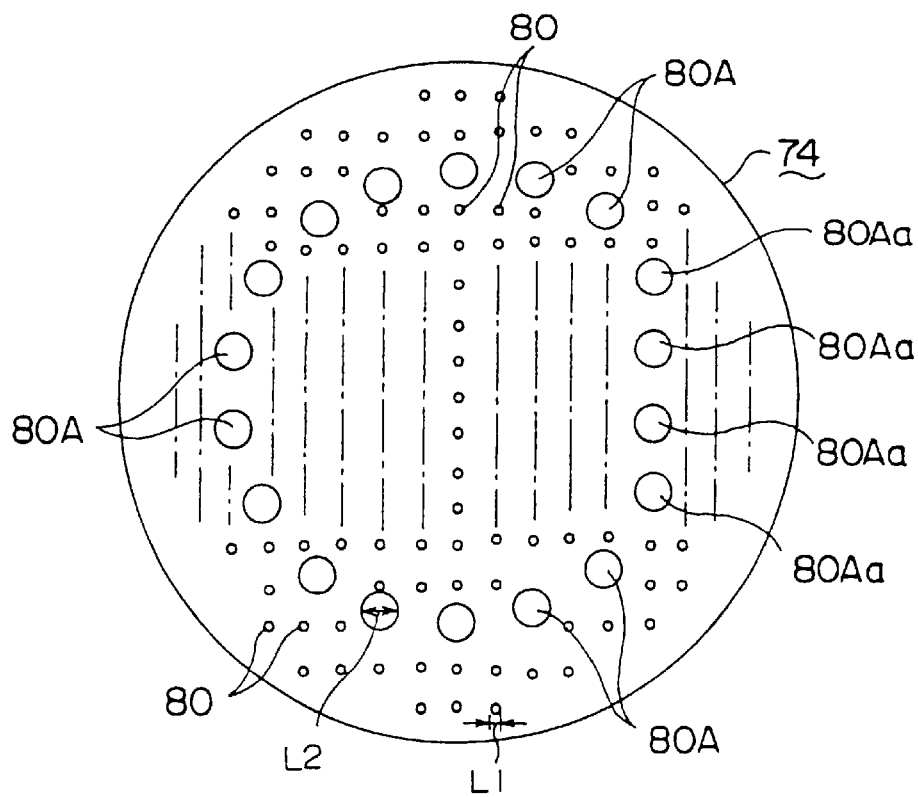
FIG. 3 is a bottom view of the shower head part shown in FIG. 2.

FIG. 1 is a sectional view showing a thin-film deposition process system as a preferred embodiment of a vacuum process system according to the present invention, FIG. 2 is an enlarged sectional view showing a shower head part and supporting table part of the system shown in FIG. 1, and FIG. 3 is a bottom view of the shower head part shown in FIG. 2.

In this preferred embodiment, a thin-film deposition process system 14 has a cylindrical or box-shaped vacuum process container 16 of, e.g., aluminum. In the process container 16, a supporting table 22 for supporting thereon a semiconductor wafer 1 serving as an object to be processed is provided on a cylindrical supporting member 18, which is raised from the bottom of the process container, via a holding member 20 having, e.g., an L-shaped cross section. The supporting member 18 and the holding member 20 are made of a heat ray transmissible material, e.g., quartz. The supporting table 20 is made of, e.g., carbon material or an aluminum compound, such as AlN, having a thickness of about 1 mm.

Below the supporting table 22, a plurality of, e.g., three, lifter pins 24 are raised upwards from a supporting member 26. By vertically moving the supporting member 26 by means of a push-up rod 28 which passes through the bottom of the process container, the lifter pins 24 are inserted into lifter pin holes 30, which pass through the supporting table 22, to push up the wafer 1. The bottom end of the push-up rod 28 is connected to an actuator 34 via a flexible bellows 32 for holding the airtight state in the process container 16.

A presser unit 36 for fixing the wafer 1 serving as the object to the supporting table 22 is provided so as to face the peripheral portion of the supporting table 22. The presser unit 36 has a clamp-ring (a presser member) 38 for pressing the peripheral portion of the wafer 1 from the top to fix the peripheral portion to the supporting table 22. The clamp-ring 38 comprises, e.g., a ring-shaped ceramic plate which extends along the profile of the wafer 1 and which has a slightly smaller inner diameter than the outer diameter of the wafer 1.

The clamp-ring 38 is connected to the supporting member 26 via a supporting rod 40 which passes through the holding member 20 while ensuring a gap between the supporting rod 40 and the holding member 20, and is designed to vertically move with the lifter pins 24. A coil spring 42 is provided around the supporting rod 40 between the holding member 20 and the supporting member 26 for assisting the downward movement of the clamp-ring 38 to ensure that the wafer is clamped. The lifter pins 24, the supporting member 26 and the holding member 20 are also made of a heat ray transmissible member, such as quartz.

In addition, a transmission window 44 of a heat ray transmissible material, such as quartz, is airtightly provided in the bottom of the process container 16 directly below the supporting table 22. Below the transmission window 44, a box-shaped heating chamber 46 is provided so as to surround the transmission window 44. In the heating chamber 46, a plurality of heating lamps 48 serving as a heating part are mounted on a rotating table 50 also serving as a reflecting mirror. The rotating table is rotated by a rotating motor 54 which is provided on the bottom of the heating chamber 46 via a rotating shaft 52. Therefore, heat rays emitted from the heating lamps 48 pass through the transmission window 44, so that the bottom face of the supporting table 22 is irradiated with the heat rays to be heated.

In the side wall of the heating chamber 46, a cooling air inlet 56 for introducing cooling air for cooling the interior of the chamber and the transmission window 44, and a cooling air outlet 58 for exhausting the cooling air are provided.

Around the outer periphery of the supporting table 22, a ring-shaped straightening vane 62 having a large number of straightening holes 60 is supported on an annular supporting column 64 which extends in vertical directions. On the inner peripheral side of the straightening vane 62, there is provided a ring-shaped attachment 66 of quartz for contacting the outer periphery of the clamp-ring 38 to prevent gas from flowing below the clamp-ring 38. An outlet 68 is provided in the bottom of the process container 16 below the straightening vane 62. The outlet 68 is communicated with an exhaust passage 70 which is connected to a vacuum pump (not shown), so that a predetermined degree of vacuum can be maintained in the process container 16. On the side wall of the process container 16, there is provided a gate valve 72 which is open and closed when the wafer is introduced into and discharged from the process container 16.

On the other hand, the ceiling portion of the process container 16 facing the supporting table 22 is provided with a shower head part 74, which serves as a feature of the present invention, for introducing a process gas and so forth into the process container 16. Specifically, the shower head part 74 has a cylindrical head body 76 of, e.g., aluminum, and the ceiling portion of the head body 76 is provided with a gas inlet 79.

The gas inlet 79 is connected to a gas source for a process gas, which is required to carry out the process, e.g., for $WF_6$, Ar, $SiH_4$, $H_2$ or $N_2$ gas, so as to be able to control the flow rate thereof. In the substantially whole gas injecting face 76A which is the bottom face of the head body 76, there are arranged a large number of gas nozzles 80 and 80A for injecting gas, which is supplied into the head body 76, toward the surface of the wafer. Also as shown in FIGS. 2 and 3, the gas nozzles 80 and 80A are provided over a range which is slightly greater than the facing surface of the wafer 1.

If the gas injecting face 76A, which is the bottom face of the shower head part 74, is divided into a facing portion, which faces the inner peripheral edge 38A of the clamp-ring (presser member) 38, and a non-facing portion other than the facing portion, the gas injecting face 76A is formed so that the gas injection quantity per unit area of the non-facing portion is substantially uniform and so that the gas injection quantity per unit area of the facing portion is greater than that of the non-facing portion.

Specifically, on the gas injecting face 76A of the shower head part 74, the non-facing portion exists inside and outside of the facing portion which is positioned substantially directly above the inner peripheral edge 38A of the clamp-ring 38. In addition, the gas injection quantity per unit area of the gas nozzles 80 in the non-facing portion is set to be substantially uniform, and the gas injection quantity per unit area of the gas nozzles 80A in the facing portion is set to be greater than that of the gas nozzles 80 in the non-facing portion.

More specifically, on the gas injecting face 76A of the shower head part 74, the gas nozzles 80 and 80A are arranged so as to be substantially latticed in a greater range than the area of the wafer. Then, the diameter L2 of each of the gas nozzles 80A, which are positioned substantially directly above the inner peripheral edge 38A of the clamp-ring 38, is set to be slightly greater than the diameter L1 of each of the gas nozzles 80 inside and outside thereof, so that the gas injection quantity from the large-diameter gas nozzles 80A is greater than the gas injection quantity from the gas nozzles 80. In particular, the diameter and position of each of the large-diameter gas nozzles 80A are greatly concerned in the uniformity of the thickness of the film as will be described later. The large-diameter gas nozzles 80A are preferably positioned substantially directly above the inner peripheral edge 38A of the clamp-ring 38.

In addition, the wafer 1 is provided with an orientation flat, which is formed by linearly cutting a part of the outer peripheral portion of the wafer, or a notch, which is formed by semi-circularly cutting a part of the outer peripheral portion of the wafer, as a positioning cut-out. The large-diameter gas nozzles 80A are arranged so as to correspond to the profile of such a wafer 1. In FIG. 3, the right-side four large-diameter gas nozzles 80A*a* correspond to the orientation flat (not shown) of the wafer 1.

In the shown example, the large-diameter gas nozzles 80A are shown so as to have a diameter several times or more as large as the diameter of each of the usual gas nozzles 80 in order to facilitate understanding of explanation. However, in an actual system, each of the large-diameter gas nozzles 80A has a diameter about 1.5 times as large as the diameter L1 of each of the usual gas nozzles 80. Specifically, when a wafer to be processed has a size of about 6 inches to about 12 inches (15 cm to 30 cm), the diameter L1 is about 1.0 mm, and the diameter L2 is about 1.5 mm. In this case, the pitch of the gas nozzles 80 is about 3 mm to about 4 mm, so that the number of the gas nozzles 80 and 80A is very large.

In addition, in the shown example, the large-diameter gas nozzles 80A are arranged in a line. However, these nozzles may be arranged in two liners or more.

Moreover, in FIG. 2, the thickness L4 of the clamp-ring 38 is about 2 mm, and the width L5 thereof is about 40 mm. In addition, the overlapping width L6 of the clamp-ring 38 with the peripheral portion of the wafer is about 1 mm to about 2 mm, and the distance L3 between the shower head part 74 and the wafer 1 is about 20 mm. In addition, as shown in FIG. 1, two diffusion plates 84 and 86 of upper and lower stages having a large number of gas dispersing holes 82 are provided in the head body 76 for more uniformly supplying gas to the surface of the wafer.

With above described construction, the operation of this preferred embodiment will be described below. First, in order to deposit a metal film of, e.g., tungsten, on the surface of a wafer, the gate valve 72 provided on the side wall of the process container 16 is open to introduce a wafer 1 into the process container 16 by means of a transfer arm, and the lifter pins 24 are pushed up to deliver the wafer 1 to the lifter pins 24. Then, the push-up rod 28 is moved downward to lower the lifter pins 24 to mount the wafer 1 on the supporting table 22, and the push-up rod 28 is further moved downwards to hold the top surface of the peripheral portion of the wafer 1 by means of the clamp-ring 38, which is a part of the presser unit 36, to fix the peripheral portion of the wafer 1.

Then, process gases, such as $WF_6$, $SiH_4$ and $H_2$, are supplied in predetermined quantities from process gas sources (not shown) to the shower head part 74 to be mixed therein, and the mixture is supplied to the process container 16 from the gas nozzles 80 and 80A of the bottom face of the head body 76. Simultaneously, the process container 16 is evacuated from the outlet 68 to be set so as to have a predetermined degree of vacuum, e.g., in the range of from 200 Pa to 11000 Pa, and heat rays are emitted while rotating the heating lamp 48 in the heating chamber 46.

The emitted heat rays pass through the transmission window 44 to pass through the supporting member 26 of quartz, so that the reverse surface of the supporting table 22 is irradiated with the heat rays to be heated. As described above, the supporting table 22 is rapidly heated since it has a very small thickness of about 1 mm. Therefore, the wafer 1 mounted thereon can be rapidly heated to a predetermined temperature. The supplied mixed gas causes a predetermined chemical reaction, so that, e.g., a tungsten film is deposited on the surface of the wafer.

In this preferred embodiment, with respect to the gas nozzles 80 and 80A of the shower head part 74, a predetermined amount of gas is uniformly injected from each of the gas nozzles 80 which are arranged inside and outside of the large-diameter gas nozzles 80A, whereas a relatively large amount of gas is injected from the large-diameter gas nozzles 80A which are provided so as to correspond to the inner peripheral edge 38A of the clamp-ring 38.

As a result, the concentration or partial pressure of the process gas on the inner peripheral side of the clamp-ring 38 is enhanced, and the concentration or partial pressure of the gas from the usual gas nozzles 80 on the inside is reduced by the large amount of gas which is injected from the large-diameter gas nozzles 80A. Therefore, the thin-film deposition on the center portion of the wafer is slightly suppressed, and the thin-film deposition in the peripheral portion of the wafer is slightly promoted, so that the uniformity of the thickness of the film can be improved.

In this case, the usual gas nozzles 80 are also preferably provided outside of the large-diameter gas nozzles 80A to some extent, e.g., several centimeters, to improve the uniformity of the thickness of the film. Because it is required to inject the gas so as to deposit the film on the top face of the clamp-ring 38 to some extent in order to improve the uniformity of the thickness of the film in the plane of the wafer.

In an actual thin-film deposition operation, e.g., a tungsten film, is generally formed on an underlying TiN film. The deposition of the tungsten film includes a main thin-film deposition operation, and a nucleus growth thin-film deposition operation which is carried out only for a short time prior to the main thin-film deposition operation in order to facilitate the thin-film deposition during the main thin-film deposition operation. According to this preferred embodiment, the in-plane uniformity of the thickness of the film can be improved in both of the nuclear growth thin-film deposition operation and the main thin-film deposition operation.

The in-plane uniformity of the thin-film deposition was evaluated with respect to the structures of various shower head parts. This will be described below.

For evaluation, a wafer having a diameter of 8 inches (20 cm) was used to be pressed and held by the clamp-ring so that the overlapping width L6 (see FIG. 2) of the peripheral portion of the wafer is about 1 mm. As a result, the diameter (see FIG. 2) between the inner peripheral edges 38A of the clamp-ring 38 is 198 mm.

Figure 4A:
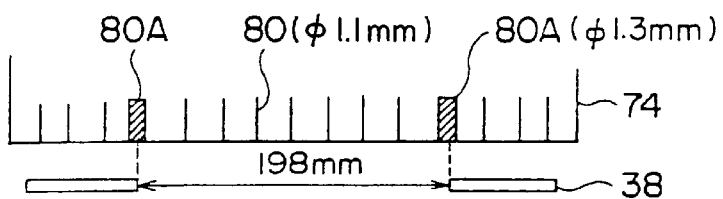
FIGS. 4A through 4F are schematic views showing shower head parts in examples of the present invention and in comparative examples, which are formed for evaluating the uniformity of the thickness of a film in the system according to the present invention.
Figure 4B:
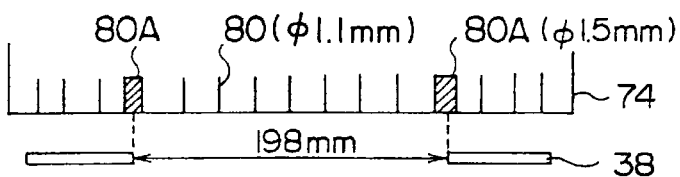
Figure 4C:
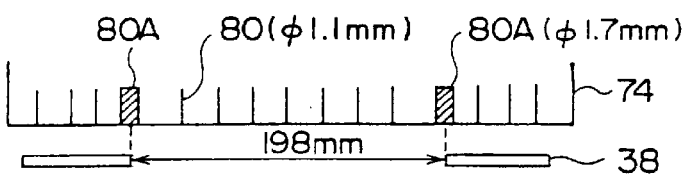
Figure 4D:
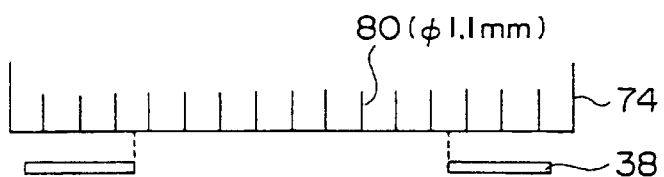
Figure 4E:
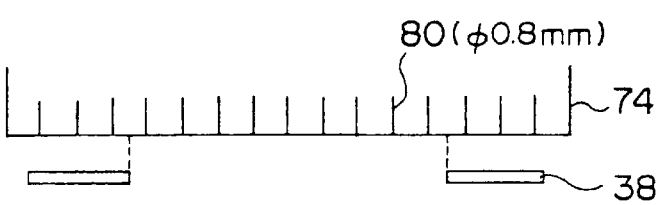
Figure 4F:
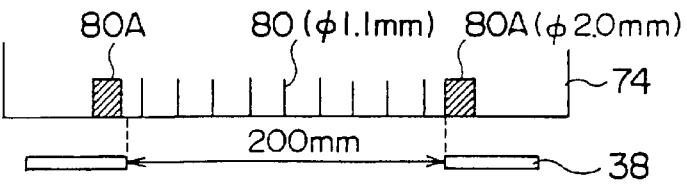
Figure 7:
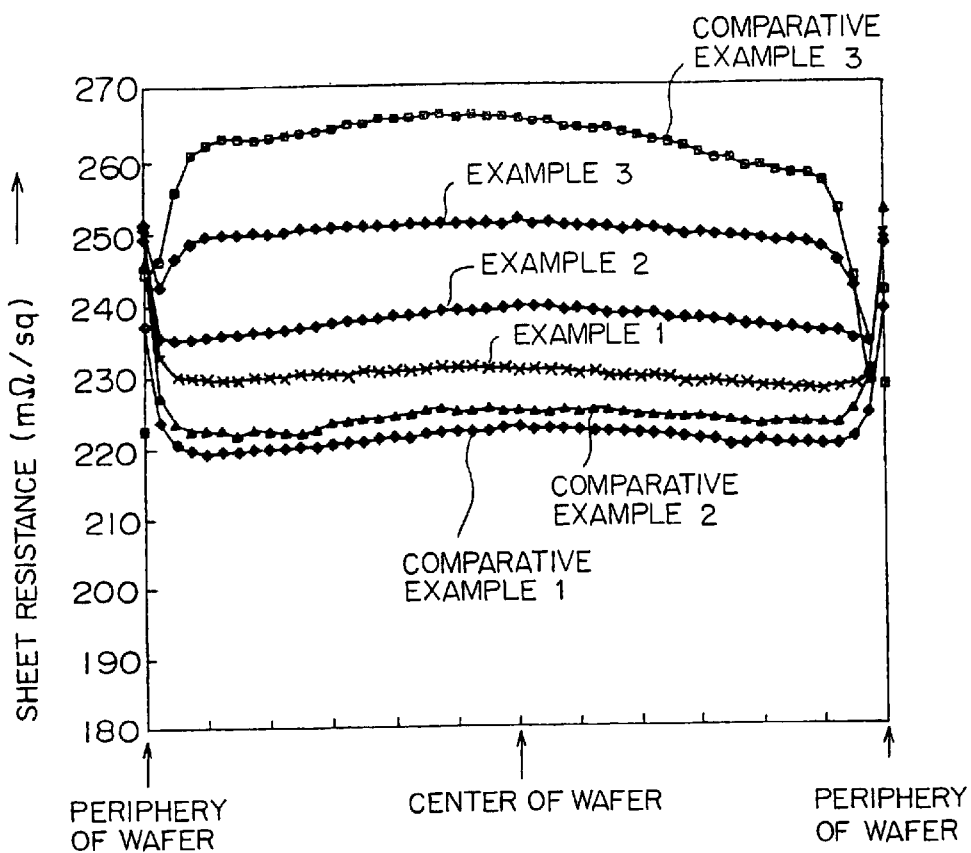
FIG. 7 is a graph showing sheet resistances (in inverse proportion to the thickness of the film) of the respective portions of the wafer in the examples and comparative examples.

As schematically shown in FIGS. 4A through 4F, the structures of shower head parts in three examples of the present invention and three comparative examples were prepared. The dimensions of the respective portions and the evaluated results thereof are shown in FIGS. 5 and 7. FIGS. 4A through 4C show examples 1 through 3 of the present invention, and FIGS. 4D through 4F show comparative examples 1 through 3.

In the shower head part in example 1 shown in FIG. 4A, large-diameter gas nozzles 80A having a diameter L2 of 1.3 mm were arranged in the form of a ring (linearly arranged in a portion corresponding to an orientation flat) at positions of a radius R (a distance from the center of the gas injecting surface 76A, and R will be the same hereinafter) of 99 mm (a diameter of 198 mm), and the diameter L1 of other usual gas nozzles 80 arranged substantially in the form of a lattice was set to be 1.1 mm. In addition, the outermost peripheral gas nozzles 80 are arranged on a circle having a diameter of 230 mm.

In the shower head part in example 2 shown in FIG. 4B, large-diameter gas nozzles 80A having a diameter L2 of 1.5 mm were provided at positions of a radius R of 99 mm (a diameter of 198 mm), and the diameter L1 of other usual gas nozzles 80 was set to be 1.1 mm which was the same as that in the above described example. In addition, the outermost peripheral gas nozzles 80 are arranged on a circle having a diameter of 230 mm.

In the shower head part in example 3 shown in FIG. 4C, large-diameter gas nozzles 80A having a diameter L2 of 1.7 mm were provided at positions of a radius R of 99 mm (a diameter of 198 mm), and the diameter L1 of other usual gas nozzles 80 was set to be 1.1 mm which was the same as that in the above described example. In addition, the outermost peripheral gas nozzles 80 are arranged on a circle having a diameter of about 230 mm.

The shower head part in comparative example 1 shown in FIG. 4D has been conventionally used. This shower head part is provided with usual gas nozzles 80 having a diameter L1 of 1.1 mm, which are uniformly dispersed substantially in the form of a lattice, and no large-diameter gas nozzles. In addition, the outermost peripheral gas nozzles 80 are arranged on a circle having a diameter of about 230 mm.

In the shower head part in comparative example 2 shown in FIG. 4E, usual gas nozzles 80 having a diameter L1 of 0.8 mm, which is smaller than that in the above described comparative example 1, are provided so as to be uniformly dispersed substantially in the form of a lattice, and no large-diameter gas nozzles are provided. In addition, the outermost peripheral gas nozzles 80 are arranged on a circle having a diameter of about 230 mm.

In the shower head part in comparative example 3 shown in FIG. 4F, large-diameter gas nozzles 80A having a diameter L2 of 2.0 mm were provided at positions of a radius R of 100 mm (a diameter of 200 mm), and usual gas nozzles 80 having a diameter L1 of 1.1 mm, which was the same as that in each of the above described examples, were provided only inside of the large-diameter gas nozzles 80A.

Furthermore, in all of the examples and comparative examples, the distance L3 between the wafer and the shower head was set to be 17 mm. The thin-film deposition conditions during the nuclear growth thin-film deposition operation and main thin-film deposition operation are shown in FIG. 6. In addition, Ar gas was used as a carrier gas, and $N_2$ gas was used as a diluting gas. All of these thin-film deposition conditions are supply-limited conditions.

FIG. 7 shows sheet resistances (which are in inverse proportion to the thickness of the film) of the respective portions of the wafer in the examples and comparative examples, and FIG. 5 shows the measured results thereof. Also as shown in FIG. 7, it can be seen that the measured values in examples 1 through 3 including the values of the peripheral portion of the wafer do not so greatly vary, so that the sheet resistances (thickness) are substantially uniform. Furthermore, the uniformity in FIG. 5 is defined by the following formula.

$$\text{Uniformity}(\pm\%)=\{(\text{Maximum-Thickness}-\text{Minimum-Thickness})/(2\times\text{Mean-Thickness})\}\times 100$$

Specifically, as can be clearly seen from FIG. 5 showing the values shown in FIG. 7, in examples 1 through 3 of the present invention, the uniformity of the thickness of the film in the nuclear growth thin-film deposition operation is 4.43% or less, and the uniformity of the thickness of the film in the main thin-film deposition operation is 5.16% or less. In all cases, although the thin-film deposition rate is slightly lower than those in comparative examples 1 through 3, it is possible to greatly improve the uniformity of the thickness of the film. In particular, it was revealed that in examples 2 and 3, the uniformity of the thickness of the film in the main thin-film deposition operation, which was a film thickness controlling factor, was 3.94% and 4.27%, respectively, which were very excellent, and that example 2 was most preferred.

On the other hand, in the case of the conventional shower head part shown in comparative example 1, the uniformity of the thickness of the film in the main thin-film deposition operation and nuclear growth thin-film deposition operation was 5.25% and 11.18%, respectively, which were inferior to those in the examples. In comparative examples 2 and 3, although the uniformity of the thickness of the film in the nuclear growth thin-film deposition operation was superior to that in comparative example 1, the uniformity of the thickness of the film in the main thin-film deposition operation was 6.98% and 9.27%, respectively, which were greatly inferior to that in comparative example 1.

It should be particularly noted that even if the large-diameter gas nozzles 80A are provided as shown in comparative example 3, the positions and diameter thereof are slightly different from those in examples 1 through 3 by about 1 mm, and if the usual gas nozzles are not provided on the outer periphery of the large-diameter gas nozzles 80A, the uniformity of the thickness of the film deteriorates. Also from this, it can be seen that the positions and diameter of the large-diameter gas nozzles 80A are very great factors.

That is, it is revealed that the uniformity of the thickness of the film in both of the nuclear growth thin-film deposition operation and main thin-film deposition operation can be improved by precisely arranging the large-diameter gas nozzles 80A having a pore size, which is not so great, above the inner peripheral edge 38A of the clamp-ring 38.

The more detailed evaluation with respect to the installed positions of the large-diameter gas nozzles 80A was carried out. This will be described below.

Figure 8:
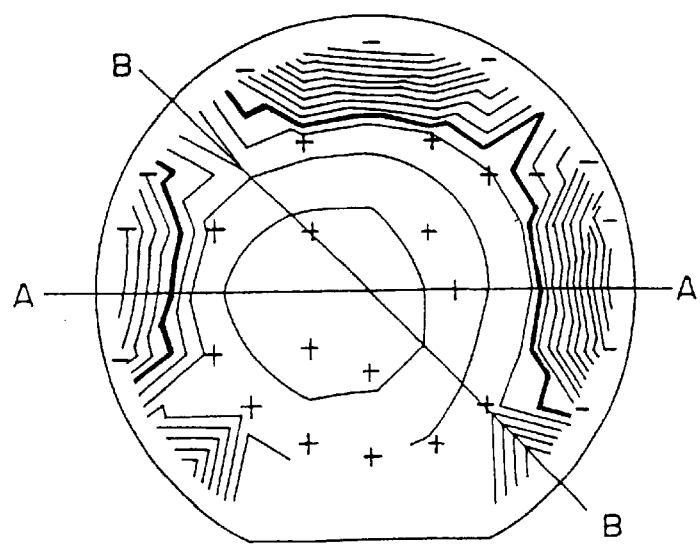
FIG. 8 is a contour map of the thickness of the film on the surface of the wafer for evaluating the uniformity of the thickness of the film, depending on the positions of large-diameter gas nozzles.
Figure 9:
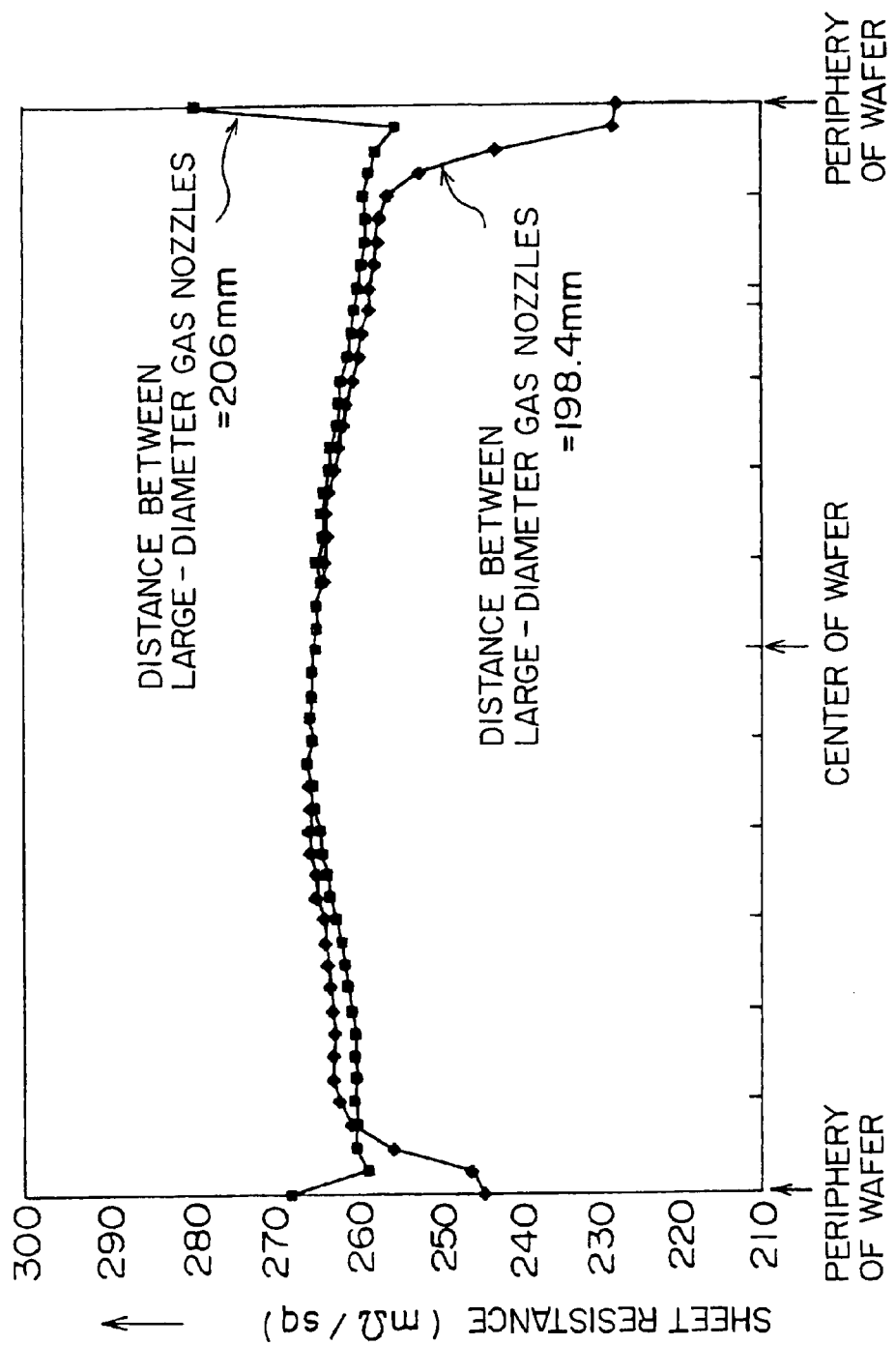
FIG. 9 is a graph showing sheet resistances (in inverse proportion to the thickness of the film) in directions of lines A—A and B—B of FIG. 6.
Figure 11:
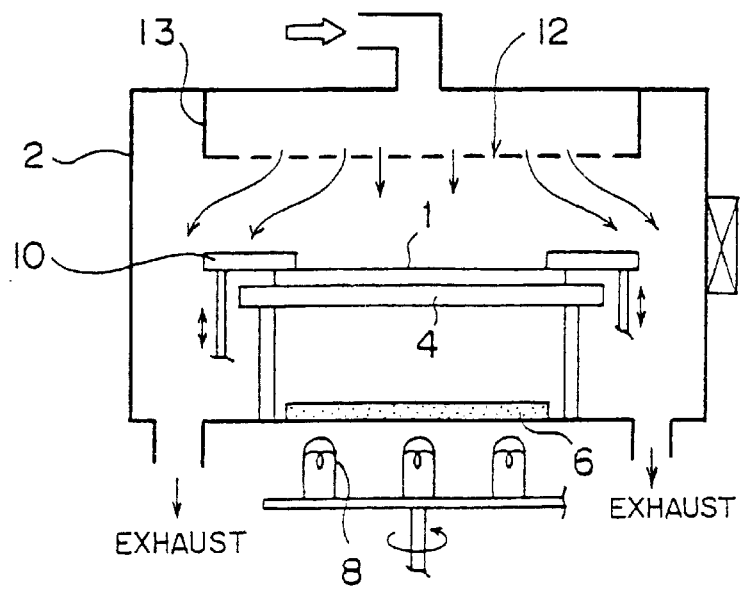
FIG. 11 is a schematic sectional view showing a thin-film deposition process system as a typical vacuum process system, to which the present invention is applied.

FIG. 8 is a contour map of the thickness of the film on the surface of the wafer for evaluating the uniformity of the thickness of the film, depending on the positions of large-diameter gas nozzles, and FIG. 9 is a graph showing sheet resistances (in inverse proportion to the thickness of the film) in directions of lines A—A and B—B of FIG. 8.

A shower head part similar to the shower head part shown in FIG. 4F for use in comparative example 3 was used. The diameter L2 of the large-diameter gas nozzles was set to be 2 mm. The radius from the center of the gas injecting face 76A to the gas nozzles 80A was set to be 99.2 mm in line A—A directions and 103 mm in line B—B directions. Thus, a thin-film deposition was carried out. Furthermore, no usual gas nozzles 80 were provided around the outer region of the large-diameter gas nozzles 80A.

In this case, as can be clearly seen from FIG. 9, if the installed positions of the large-diameter gas nozzles 80A are slightly moved by 3.8 mm (=103 mm−99.2 mm), the thickness of the film in the peripheral portion of the wafer is extremely varied. Thus, it is revealed that the installed positions of the large-diameter gas nozzles 80A are very important to improve the uniformity of the thickness of the film. Furthermore, the thick solid lines in FIG. 8 show the contour lines of the mean value of the thickness, wherein sign "+" denotes a portion having a greater thickness than the mean value and wherein sign "−" denotes a portion having a smaller thickness than the mean value.

As described above, according to the thin-film deposition process system in this preferred embodiment, the gas injection quantity per unit area from the shower head part 74 is substantially uniform in the non-facing portion, and the gas injection quantity per unit area in the facing portion is greater than that in the non-facing portion. Therefore, the quantity of the deposition in the central portion of the wafer 1, in which the thickness of the film tends to be great, can be relatively suppressed, and the quantity of the deposition in the peripheral portion of the wafer, in which the thickness of the film tends to be small, can be relatively promoted, so that the whole uniformity of the thickness of the film can be greatly improved. In particular, it is possible to improve the uniformity of the thickness of the film under the supply-limited conditions, in which the distribution of the concentration of the process gas serves as a controlling factor with respect to the thin-film deposition rate.

Furthermore, in the above described preferred embodiment, while the large-diameter gas nozzles 80A having a greater diameter than those of other gas nozzles 80 have been provided in order to increase the gas injection quantity per unit area in the shower head portion 74, the present invention should not be limited thereto. For example, as shown in FIG. 10, the density of the gas nozzles 80B in a portion, in which the gas injection quantity per unit area should be increased, may be increased, so that the gas injection quantity per unit area is increased. Also in this case, the same effects as the above described effects can be obtained. In this case, the diameter of each of the gas nozzles 80B in the portion, in which the density is increased, is the same as the diameter of each of the gas nozzles 80 around the gas nozzles 80B, so that the piercing can be carried out by means of the same drill.

In addition, while the deposition of the tungsten film has been described as examples in the above described preferred embodiment, the present invention may be limited to the thin-film deposition of other materials, e.g., the thin-film deposition of WSi, Ti, TiN, TiSi, Si or $SiO_2$. In addition, the heating part of the vacuum process system should not be limited to the heating part based on lamp heating, but a heating part based on resistance heating may be used. Moreover, the wafer size should not be limited to 8 inches (20 cm), but the wafer size may be any one of 6 inches (15 cm), 12 inches (30 cm) and greater sizes.

Moreover, while the vacuum process system formed as the thin-film deposition process system has been described as an example in the above described preferred embodiment, the present invention may be applied to a vacuum process system formed as another process system, such as an etching system, if the vacuum process system is provided with a shower head part having a large number of gas nozzles facing a supporting table. For example, if the present invention is applied to an etching system serving as a vacuum process system, it is possible to improve the in-plane uniformity for the etching of an object to be processed.

What is claimed is:

1. A vacuum process system comprising:
   a vacuum process container having therein a supporting table for supporting thereon an object to be processed;
   a presser member for pressing a top surface of a peripheral portion of said object to fix said object to said supporting table; and
   a shower head part facing said supporting table and having a number of gas nozzles in a bottom face thereof;

wherein said bottom face of said shower head part is divided into a facing portion positioned substantially directly above an inner peripheral edge of said presser member, and a non-facing portion present inside and outside of said facing portion;

wherein a diameter of at least part of said gas nozzles in said facing portion of said shower head part is set to be greater than a diameter of said gas nozzles in said non-facing portion.

2. A vacuum process system as set forth in claim 1, wherein a density of said gas nozzles in at least part of said facing portion of said shower head part is set to be greater than a density of said gas nozzles in said non-facing portion.

3. A vacuum process system comprising:

a vacuum process container having therein a supporting table for supporting thereon an object to be processed;

a presser member for pressing a top surface of a peripheral portion of said object to fix said object to said supporting table; and a shower head part facing said supporting table and having a number of gas nozzles in a bottom face thereof;

wherein said bottom face of said shower head part has an annular region, an inner region inside of said annular region, and an outer region outside of said annular region;

wherein said annular region is formed substantially directly above the inner peripheral edge of said presser member along the shape of said inner peripheral edge;

wherein a diameter of at least part of said gas nozzles in said annular region is set to be greater than a diameter of said gas nozzles in the inner region and the outer region.

4. A vacuum process system comprising:

a vacuum process container having therein a supporting table for supporting thereon an object to be processed;

a presser member for pressing a top surface of a peripheral portion of said object to fix said object to said supporting table; and a shower head part facing said supporting table and having a number of gas nozzles in a bottom face thereof, wherein said bottom face of said shower head part is divided into a facing portion positioned substantially directly above said inner peripheral edge of said presser member, and non-facing portions present inside and outside of said facing portion, wherein a density of said gas nozzles in at least part of said facing portion of said shower head part is set to be greater than a density of said gas nozzles in each non-facing portion.

5. A vacuum process system as set forth in claim 4, wherein a diameter of at least part of said gas nozzles in said facing portion of said shower head part is set to be greater than a diameter of said gas nozzles in one of said non-facing portions.

6. A vacuum process system according to claim 4, wherein said facing portion is annular.

* * * * *